(12) United States Patent
Nemati (10) Patent No.: US 8,441,881 B1
(45) Date of Patent: May 14, 2013

(54) TRACKING FOR READ AND INVERSE WRITE BACK OF A GROUP OF THYRISTOR-BASED MEMORY CELLS

(75) Inventor: Farid Nemati, Redwood City, CA (US)

(73) Assignee: T-RAM Semiconductor, San Jose, CA (US)

( * ) Notice: Subject to any disclaimer, the term of this patent is extended or adjusted under 35 U.S.C. 154(b) by 163 days.

(21) Appl. No.: 13/172,630

(22) Filed: Jun. 29, 2011

Related U.S. Application Data (60) Provisional application No. 61/361,361, filed on Jul. 2, 2010.

(51) Int. Cl.
*G11C 5/14* (2006.01)

(52) U.S. Cl.
USPC ............... 365/227; 365/189.16; 365/189.15; 365/180

(58) Field of Classification Search ............... 365/227, 365/189.15, 189.16, 180
See application file for complete search history.

(56) References Cited

U.S. PATENT DOCUMENTS

| | | | | |
|---|---|---|---|---|
| 4,672,916 A | * | 6/1987 | Steiner | 119/57.7 |
| 4,791,604 A | * | 12/1988 | Lienau et al. | 365/9 |
| 4,937,830 A | * | 6/1990 | Kawashima et al. | 714/772 |
| 5,128,947 A | * | 7/1992 | Corrigan | 714/816 |
| 6,392,916 B1 | * | 5/2002 | Choi et al. | 365/145 |
| 6,611,452 B1 | | 8/2003 | Han | |
| 6,721,220 B2 | | 4/2004 | Yoon | |
| 6,734,815 B1 | | 5/2004 | Abdollahi-Alibeik | |
| 6,735,113 B2 | | 5/2004 | Yoon | |
| 6,756,838 B1 | | 6/2004 | Wu | |
| 6,778,435 B1 | | 8/2004 | Han | |
| 6,781,888 B1 | | 8/2004 | Horch | |
| 6,785,169 B1 | | 8/2004 | Nemati | |
| 6,804,162 B1 | | 10/2004 | Eldridge | |
| 6,885,581 B2 | | 4/2005 | Nemati | |
| 6,891,774 B1 | | 5/2005 | Abdollahi-Alibeik | |
| 6,903,987 B2 | | 6/2005 | Yoon | |
| 6,937,085 B1 | | 8/2005 | Samaddar | |
| 6,937,358 B2 | * | 8/2005 | Sullivan et al. | 358/1.18 |
| 6,940,772 B1 | | 9/2005 | Horch | |
| 6,944,051 B1 | | 9/2005 | Lee | |
| 6,947,349 B1 | | 9/2005 | Abdollahi-Alibeik | |
| 6,958,931 B1 | | 10/2005 | Yoon | |

(Continued)

OTHER PUBLICATIONS

U.S. Appl. No. 12/501,995, filed Jul. 13, 2009, Chopra.

(Continued)

*Primary Examiner* — Viet Q Nguyen
(74) *Attorney, Agent, or Firm* — The Webostad Firm, A Professional Corporation (57) ABSTRACT

Method and integrated circuit for tracking for read and inverse write back of a group of thyristor-based memory cells is described. The method includes: reading the group of memory cells to obtain read data, and writing back opposite data states for the read data to the group of memory cells. The group of memory cells includes data cells and at least one check cell for check data, where the check data indicates polarity of the read data. The integrated circuit includes a grouping of memory cells of an array of memory cells including data cells and at least one check cell, and sense amplifiers. The at least one check cell is to track inversion/non-inversion status of the data cells associated therewith, and the sense amplifiers are coupled to obtain read information from the grouping and to write back data states opposite of those of the read information.

20 Claims, 11 Drawing Sheets

U.S. PATENT DOCUMENTS

| | | | |
|---|---|---|---|
| 7,042,759 | B2 | 5/2006 | Nemati |
| 7,054,191 | B1 | 5/2006 | Gupta |
| 7,078,739 | B1 | 7/2006 | Nemati |
| 7,089,439 | B1 | 8/2006 | Abdollahi-Alibeik |
| 7,096,144 | B1 | 8/2006 | Bateman |
| 7,187,530 | B2 | 3/2007 | Salling |
| 7,268,373 | B1 | 9/2007 | Gupta |
| 7,304,327 | B1 | 12/2007 | Nemati |
| 7,305,607 | B2 * | 12/2007 | Kang et al. ............... 714/764 |
| 7,319,622 | B1 | 1/2008 | Roy |
| 7,379,325 | B1 * | 5/2008 | Backus et al. ............ 365/154 |
| 7,379,381 | B1 | 5/2008 | Roy |
| 7,405,963 | B2 | 7/2008 | Nemati |
| 7,460,395 | B1 | 12/2008 | Cho |
| 7,464,282 | B1 | 12/2008 | Abdollahi-Alibeik |
| 7,573,077 | B1 | 8/2009 | Ershov |
| 7,587,643 | B1 | 9/2009 | Chopra |
| 7,738,274 | B1 | 6/2010 | Nemati |
| 7,940,558 | B2 * | 5/2011 | Slesazeck ................ 365/175 |
| 8,228,730 | B2 * | 7/2012 | Sandhu et al. ........ 365/185.08 |

OTHER PUBLICATIONS

Micron, DDR3 SDRAM, 2006, Micron Technology, Boise, Id.

BEZ, Chalcogenide PCM: A Memory Technology for Next Decade, Numonyx, R&D Technology Development, Via C. Olivetti 2, 20041, Agrate Brianza, IEEE, Jun. 2009, 5.1.1-5.1.4, Milan, Italy.

Servalli, A 45nm Generation Phase Change Memory Technology, Numonyx, R&D Technology Development, Via C. Olivetti 2, 20041 Agrate Brianza, IEEE, Jun. 2009, 5.7.1-5.7.4, Milan, Italy.

* cited by examiner

TRACKING FOR READ AND INVERSE WRITE BACK OF A GROUP OF THYRISTOR-BASED MEMORY CELLS

FIELD

One or more aspects of the invention generally relate to integrated circuit devices and operations thereof. More particularly, one or more aspects of the invention relate to tracking for read and inverse write back of a group of thyristor-based memory cells.

BACKGROUND

Semiconductor memories such as static random access memory ("SRAM") and dynamic random access memory ("DRAM") are in widespread use. DRAM is very common due to its high density with a cell size typically between $6F^2$ and $8F^2$, where F is a minimum feature size. However, DRAM is relatively slow, having an access time commonly near 20 nanoseconds ("ns"). Although SRAM access time is typically an order of magnitude faster than DRAM, an SRAM cell is commonly made of four transistors and two resistors or of six transistors, thus leading to a cell size of approximately $60F^2$ to $100F^2$.

Others have introduced memory designs based on a negative differential resistance ("NDR") cell, such as a thyristor-base memory cell, to minimize the size of a conventional SRAM memory. A thyristor-based random access memory ("RAM") may be effective in memory applications. Additional details regarding a thyristor-based memory cell are described in U.S. Pat. Nos. 6,891,205 B1 and 7,460,395 B1.

Charge leakage out of a thyristor-based memory cell negatively impacts the restore rate of such cell. Additional details regarding periodically pulsing a thyristor-based memory cell to restore or refresh state of such a cell may be found in Patent Cooperation Treaty ("PCT") International Publication WO 02/082504.

Operation of an array of thyristor-based memory cells consumes power. Accordingly, it would be desirable and useful to provide an array of thyristor-based memory cells that consumes less power.

BRIEF SUMMARY

One or more aspects generally relate to tracking for read and inverse write back of a group of thyristor-based memory cells.

An aspect is a method of operating a group of memory cells. The method includes: reading the group of memory cells to obtain read data, and writing back opposite data states for the read data to the group of memory cells. The group of memory cells includes data cells and at least one check cell, and the read data includes check data associated with the at least one check cell, where the check data indicates polarity of the read data.

Another aspect is an integrated circuit. The integrated circuit includes an array of memory cells, a grouping of memory cells of the array of memory cells including data cells and at least one check cell, and sense amplifiers. The at least one check cell is to track inversion/non-inversion status of the data cells associated therewith, and the sense amplifiers are coupled to obtain read information from the grouping and to write back data states opposite of those of the read information.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Moreover, for purposes of clarity, a single signal or multiple signals may be referred to or illustratively shown as a signal to avoid encumbering the description with multiple signal lines. Moreover, along those same lines, a transistor, among other circuit elements, may be referred to or illustratively shown as a single transistor though such reference or illustration may be representing multiples thereof. Furthermore, though particular signals and voltages may be described herein for purposes of clarity by way of example, it should be understood that the scope of the description is not limited to these particular numerical examples as other values may be used.

Before a detailed description of exemplary embodiments, discussion of some terminology surrounding thyristor-based memory cells may be helpful. Voltage on a supply voltage line may be above both a logic low voltage reference level ("Vss" or "VSS") and a logic high voltage reference level ("Vdd" or "VDD"), and this supply voltage may be used as an anodic voltage for a thyristor-based memory cell. Accordingly, reference to this supply voltage includes its anodic use, and as such it is referred to herein as "VDDA" to clearly distinguish it from Vdd. Thyristor-based memory cells have an anode or anode emitter region, a cathode or cathode emitter region, a p-base or p-base region, and an n-base or n-base region.

Thyristor-based memory cells have an anode or anode emitter region, a cathode or cathode emitter region, a p-base or p-base region, and an n-base or n-base region. Each thyristor-based memory cell may optionally include an access device, which may be a field effect transistor ("FET"), for SRAM applications. However, the exemplary embodiments described below are for DRAM application, namely thyristor-based memory cells that do not have corresponding access devices as part of the cell. This is for purposes of clarity and not limitation, as it shall be understood that either or both DRAM and SRAM applications may be used.

Thyristor-based memory cells may have an equivalent circuit model, namely a storage element, cross coupled bi-polar junction transistors ("BJTs") and a capacitor. Such storage element may be a type of a device known as Thin Capacity Coupled Thyristor ("TCCT") device. Thus, sometimes thyristor-based memory cells are alternatively referred to as TCCT cells. If the main or "first" base is n-type, then such thyristor-based memory cells may be referred to as n-TCCT cells; or, if the main or "first" base is p-type, then such thyristor-based memory cells may be referred to as p-TCCT cells. The main or first base is principally capacitively coupled to a gate of the TCCT cell. A secondary or "second" base may be located adjacent to the first base. However, the "second" base likely will have a much smaller capacitive coupling to the gate. A gate dielectric, which may be one or more layers, separates the first base, and in some embodiments the second base, from the gate.

For each thyristor-based memory cell array, there is a first wordline ("WL1") associated with either emitter node of the cells of such array. A control gate of a storage element, which may generally be associated with a plate of a capacitor, may be formed with a second wordline ("WL2"). For convenience, WL2s are associated with columns, and WL1s are associated with columns or rows, as described below in additional detail. However, an opposite orientation of WL2s may be used provided such WL2s are generally perpendicular to bitlines.

The exact number of memory cells or bits associated with a WL1 or a WL2 may vary from application to application, and may vary between SRAM and DRAM applications. Some other details regarding thyristor-based memory cells, including silicides, extension regions, and spacers, among other details, may be found in U.S. Pat. Nos. 6,767,770 B1 and 6,690,039 B1.

Figure 1A:
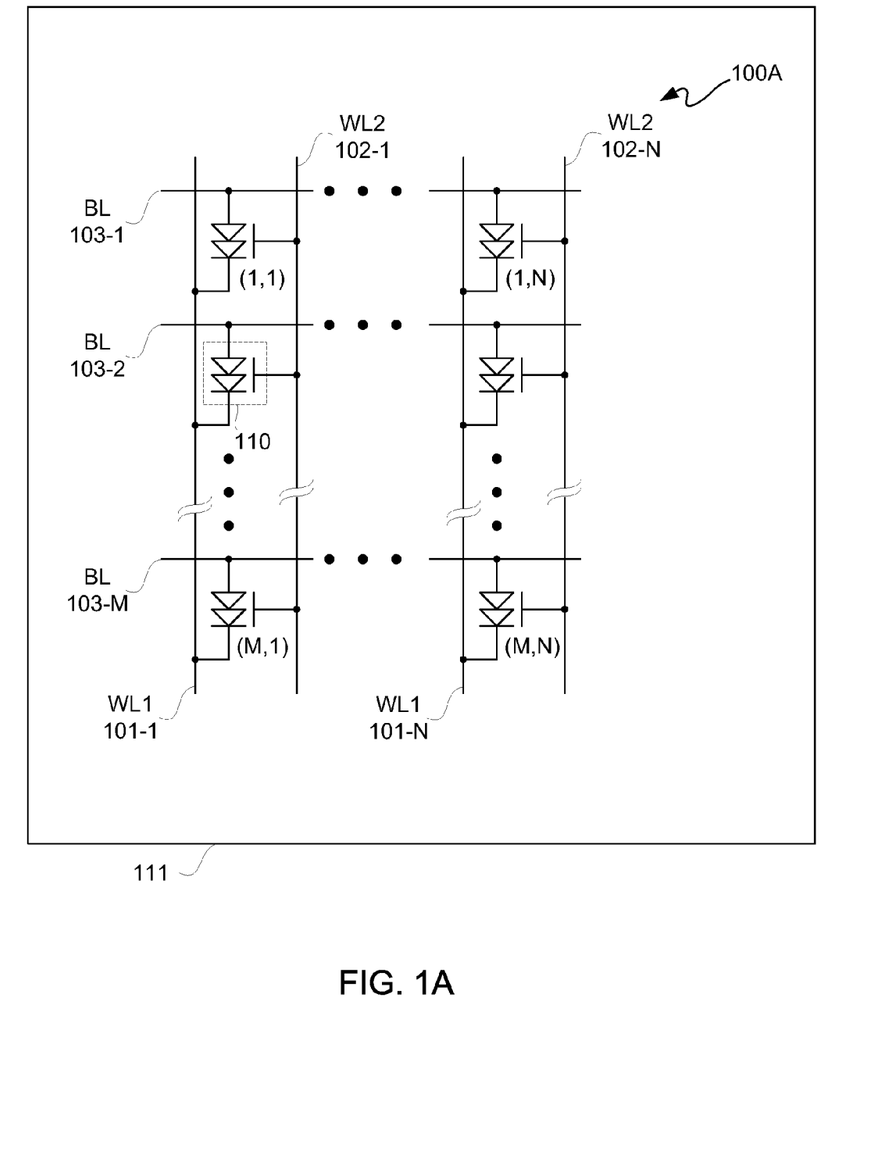
FIGS. 1A though 1D are a circuit diagrams depicting an exemplary embodiments of an integrated circuits with memory arrays.

FIG. 1A is a circuit diagram depicting an exemplary embodiment of an integrated circuit 111. Integrated circuit 111 includes a memory array 100A. Memory array 100A is coupled to memory array peripheral circuitry, which is not shown for purposes of clarity. Such peripheral circuitry may include decoders, drivers, and sense amplifiers. Integrated circuit 111 may be a host chip for memory array 100A, where the primary purpose of integrated circuit 111 is not as a memory device, namely an embedded memory array 100A. In another embodiment, integrated circuit 111 may be a memory chip in which memory array 100A is located.

Memory array 100A includes memory cells 110. Memory cells 110 are thyristor-based memory cells or TCCT cells. Memory cells 110 may be lateral cells or vertical cells, as described below in additional detail. In this exemplary embodiment, memory cells 110 are DRAM cells made of p-TCCTs. In other embodiments, an access device may be used with thyristor-based memory cells 110, which access device is not shown here for purposes of clarity.

In this exemplary embodiment of memory array 100A, there are M rows and N columns, where M and N are integers each of which is greater than one. Memory array 100A has first wordlines ("WL1") 101-1 through 101-N, second wordlines ("WL2") 102-1 through 102-N, and bitlines ("BL") 103-1 through 103-M. Accordingly, each cell may be designated by its row and column coordinates, namely (M, N) values.

Wordlines 102-1 through 102-N are coupled to or formed as part of gates of thyristor-based memory cells 110. More particularly, a wordline, such as wordline 102-1 for example, is coupled to gates of thyristor-based memory cells 110 of a first column of such cells of memory array 100A. Moreover, in this exemplary embodiment, wordlines 101-1 through 101-N and 102-1 through 102-N, are associated with columns, and bitlines, such as bitlines 103-1 through 103-M are associated with rows.

Bitlines 103-1 through 103-M may be coupled to either anode or cathode emitters of memory cells 110. In this exemplary embodiment, bitlines 103-1 through 103-M are coupled to anodes. More particularly, a row of memory cells 110, namely memory cells (1, 1) to (1, N) may all be coupled to bitline 103-1 at respective anodes of such memory cells. Wordlines 101-1 through 101-N may be coupled to columns of memory cells 110, respectively, at cathodes of such memory cells. More particularly, memory cells (1, 1) to (M, 1) may each have their associated cathode nodes coupled to wordline 101-1 for example.

Figure 1B:
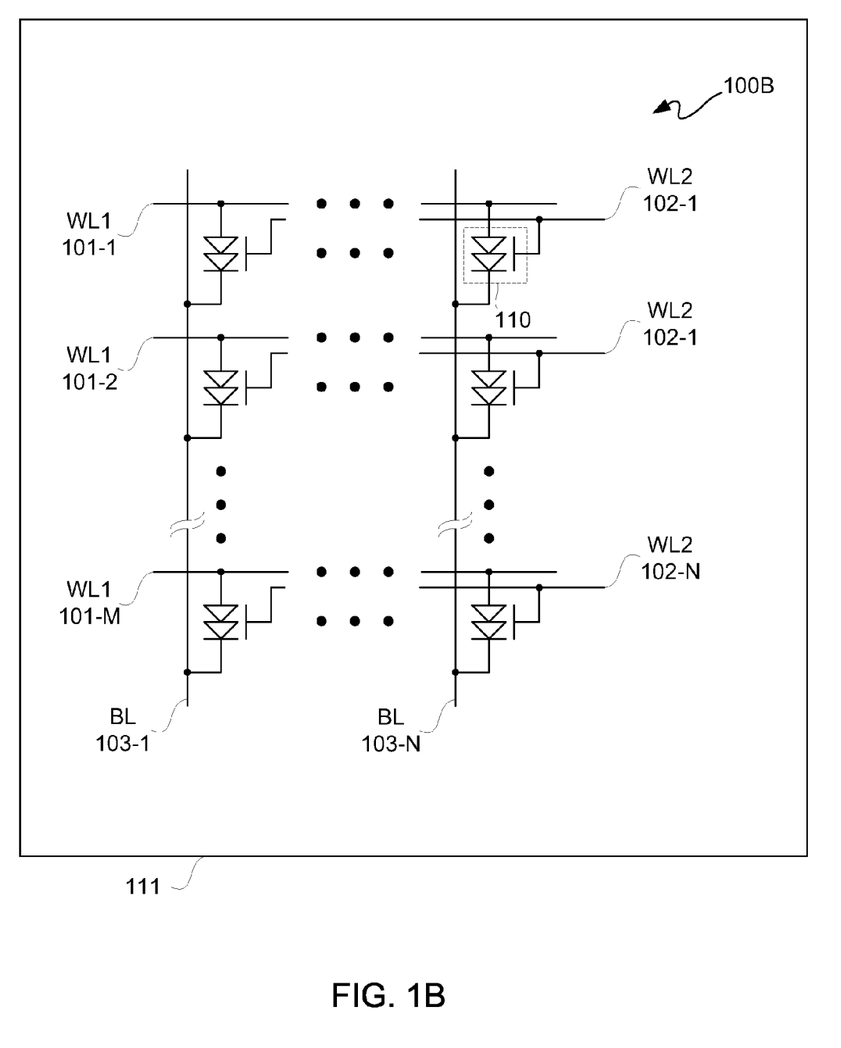

FIG. 1B is a circuit diagram depicting another exemplary embodiment of integrated circuit 111. In this depicted embodiment, integrated circuit 111 includes memory array 100B. Memory array 100B is the same as memory array 100A of FIG. 1A, except that wordlines and bitlines have been swapped and memory cells are n-TCCTs. In other words, first wordlines 101-1 through 101-M are associated with rows of thyristor-based memory cells 110, and bitlines 103-1 through 103-N are associated with columns of thyristor-based memory cells 110. Thus it should be appreciated that first wordlines may be coupled to anodes or cathodes of thyristor-based memory cells, and bitlines may be coupled to anodes or cathodes of thyristor-based memory cells.

Figure 1C:
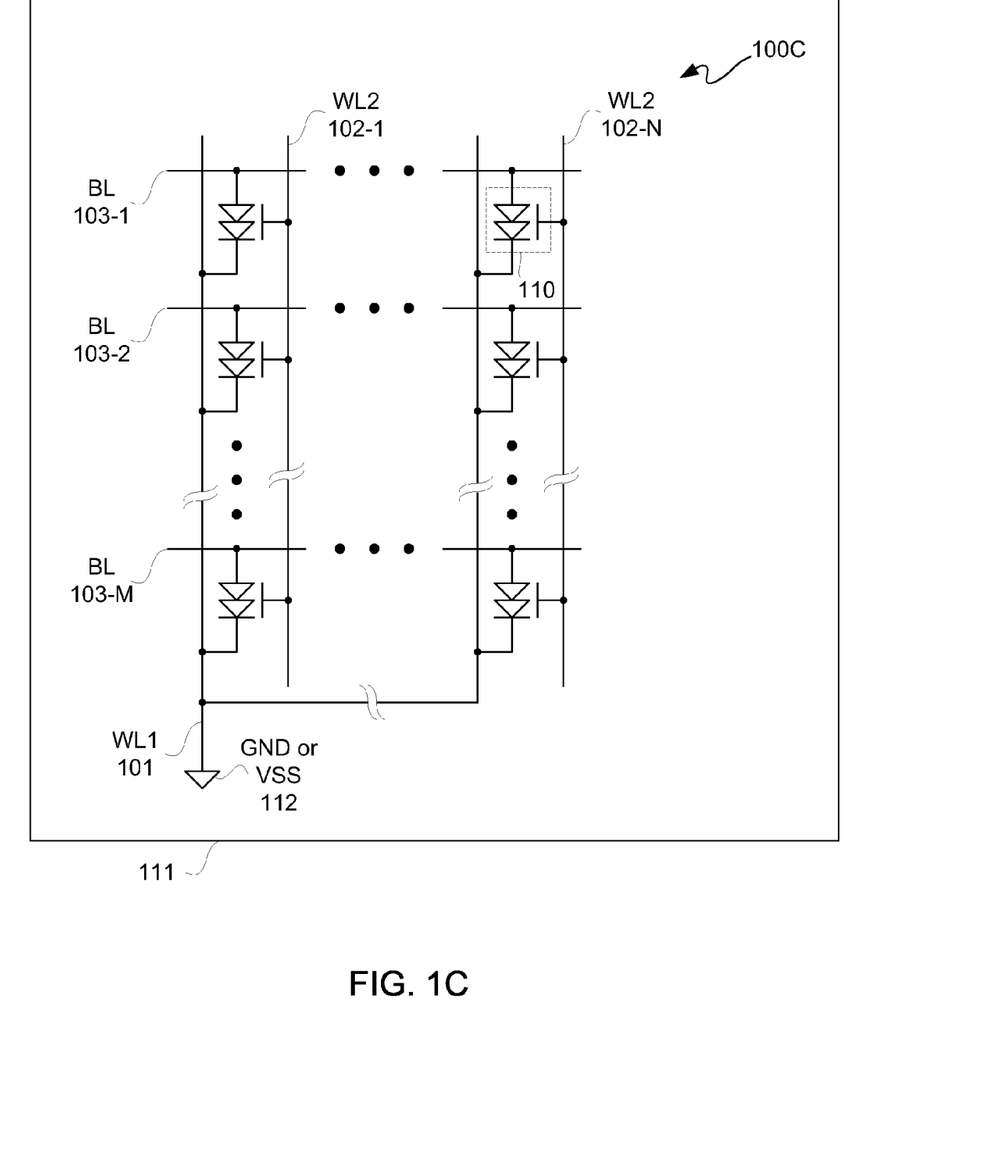

FIG. 1C is a circuit diagram depicting another exemplary embodiment of integrated circuit 111. In the depicted example embodiment, integrated circuit 111 includes memory array 100C. Memory array 100C is the same as memory array 100A of FIG. 1A, except that a single first wordline 101 is illustratively depicted as being coupled to two or more columns of thyristor-based memory cells 110. This configuration is referred to as a "common-plate" WL1 structure or a "common cathode" structure. Such first wordline 101 may be coupled to ground or Vss 112. Thus it should be appreciated that in such an embodiment, voltage on such first wordline 101 may be generally constant at a logic low voltage level, and bitlines 103 and WL2s 102 may be pulsed for operation of array 100C. In the depicted embodiment, all N columns of thyristor-based memory cells 110 are coupled to a same first wordline 101; however, not all N columns need to be connected to the same ground or Vss location. It should be understood that a Vss voltage level may be but is not necessarily a ground voltage level. For example, a VSS voltage level for a WL2 may be less than 0 V.

Figure 1D:
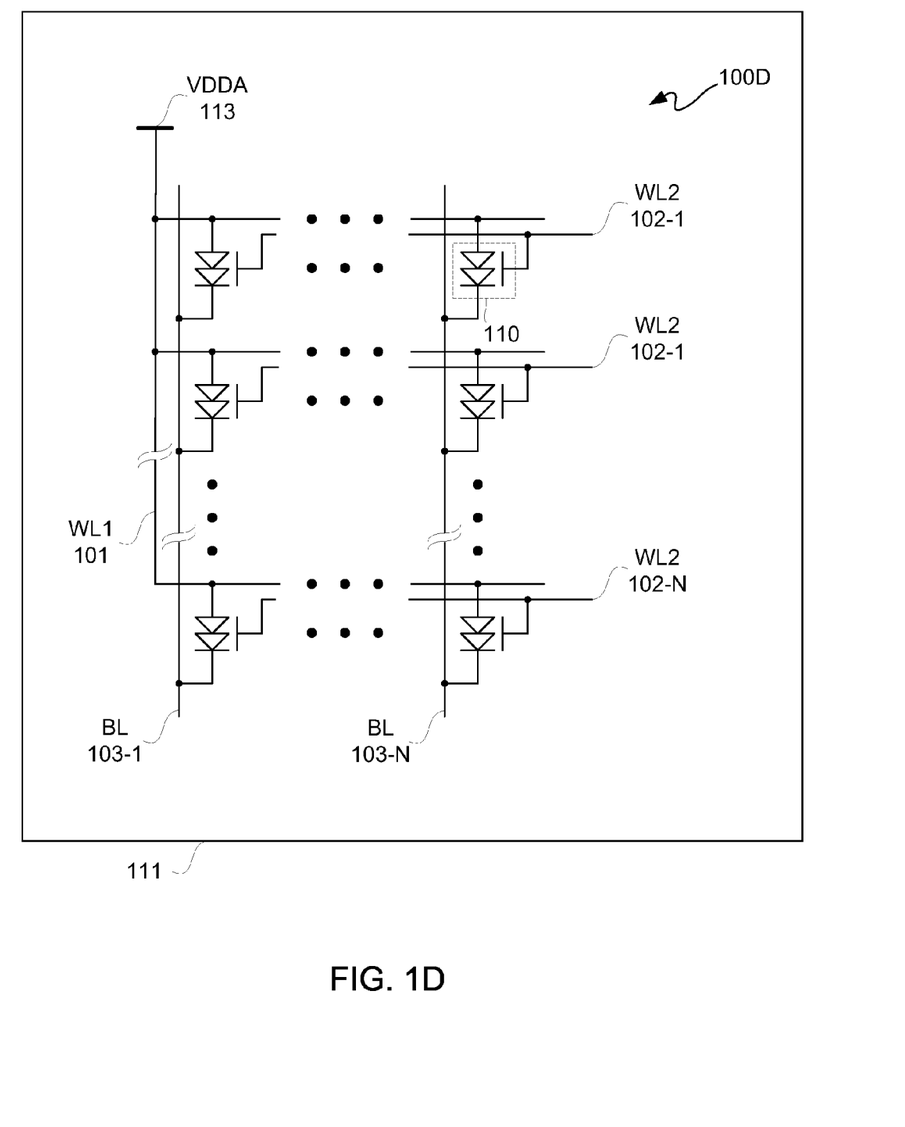

FIG. 1D is a circuit diagram depicting yet another exemplary embodiment of integrated circuit 111. In this depicted embodiment, integrated circuit 111 includes memory array 100D. Memory array 100D is the same as memory array 100B of FIG. 1B, except that two or more first wordlines are coupled together to provide a common or single first wordline 101. In this exemplary embodiment, WL1 101 is coupled to a supply voltage bus, namely VDDA bus 113.

Accordingly, it should be understood that in FIGS. 1C and 1D, respective embodiments of a "common plate" WL1 architecture are described.

Figure 2A:
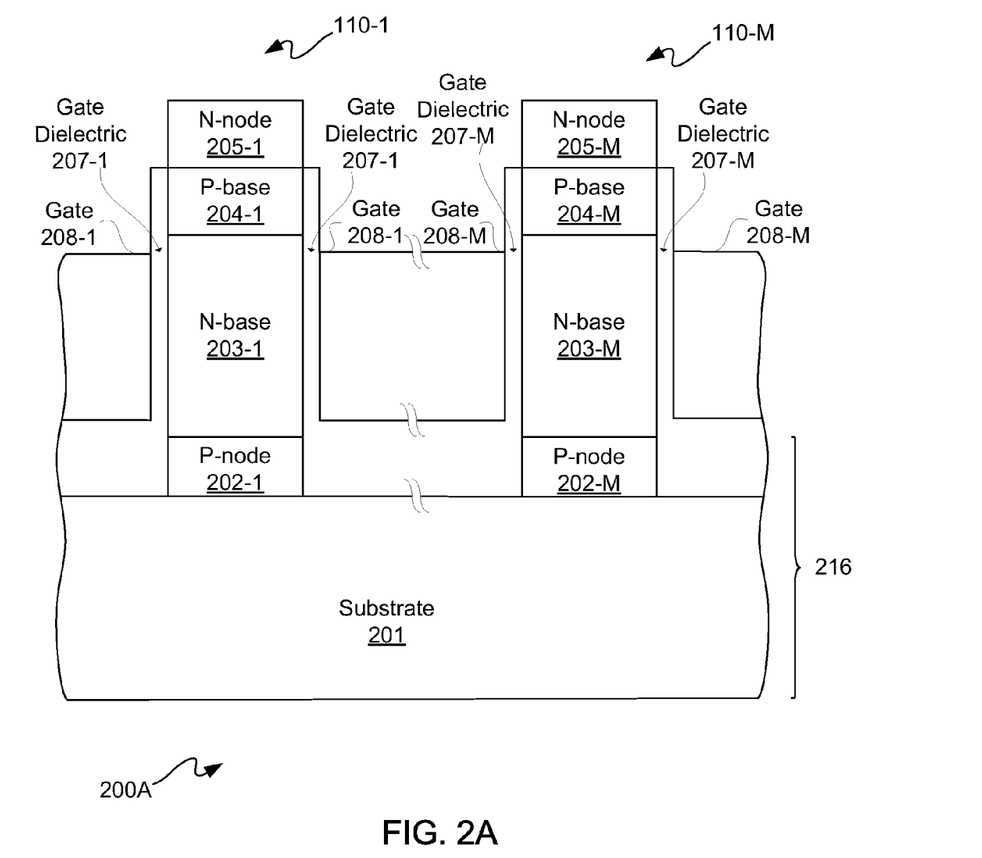
FIGS. 2A and 2B are side-view block diagrams depicting groupings of vertical thyristor-based memory cells of integrated circuits.

FIG. 2A is side-view block diagram depicting a grouping of vertical thyristor-based memory cells 110-1 through 110-M of an integrated circuit 200A. Gates 208-1 through 208-M are connected back-to-back in this cross-section taken along a WL2 102. If such cross-section were taken along a bitline 103, gates 208-1 through 208-M may not appear as being connected as such. Such memory cells 110 may be as described with reference to FIGS. 1A through 1D.

In this exemplary embodiment, vertical thyristor-based memory cells 110-1 through 110-M are depicted as being formed using a bulk semiconductor wafer 216, such as a silicon wafer for example. However, it should be understood that a bulk or semiconductor-on-insulator wafer, including a semiconductor other than silicon, may be used.

Along a top surface of semiconductor substrate 201 may be p-nodes 202-1 through 202-M, which may be a common plate of nodes. Accordingly, it should be understood that p-nodes 202-1 through 202-M may be WL1 101 of FIG. 1C. More particularly, it should be understood that p-nodes 202-1 through 202-M may be emitter nodes of thyristor-based memory cells 110-1 through 110-M, respectively. In this exemplary embodiment, p-nodes 202-1 through 202-M may be doped to be substantially p-type, and more particularly, may be doped to have a p+ doping level.

Formed directly above each p-node may be a respective n-base. More particularly, n-bases 203-1 through 203-M are respectively formed above p-nodes 202-1 through 202-M. Located directly above n-bases may be p-bases. More particularly, p-bases 204-1 through 204-M may be respectively located above n-bases 203-1 through 203-M.

Along sidewalls of the p-n-p stacks of memory cells 110-1 through 110-M may be formed one or more gate dielectric layers, which are indicated as gate dielectrics 207-1 through 207-M so as to be associated with memory cells 110-1 through 110-M. It should be understood that in some embodiments, gate dielectrics 207-1 through 207-M may completely or partially surround p-n-p stacks of memory cells 110-1 through 110-M as well as being along sidewalls thereof.

One or more gate conductive layers may be formed between such p-n-p stacks, which are indicated as gates 208-1 through 208-M so as to be respectively associated with memory cells 110-1 through 110-M. Gates 208-1 through 208-M may be respectively separated from n-bases 203-1 through 203-M by gate dielectrics 207-1 through 207-M. Gates 208-1 through 208-M may be positioned for capacitively coupling to n-bases 203-1 through 203-M, respectively, during an activation operation and/or a precharge operation, as described below in additional detail.

Furthermore, n-nodes may be formed directly above p-bases. More particularly, n-nodes 205-1 through 205-M are respectively formed above p-bases 204-1 through 204-M as other emitter nodes. In this exemplary embodiment, n-nodes 205-1 through 205-M may be doped to be substantially n-type, and more particularly, may be doped to have an n+ doping level.

Accordingly, each memory cell 110-1 through 110-M has a p-n-p-n stack structure. Additional details regarding the formation of vertical thyristor-based memory cells may be found in one or more of the above-referenced U.S. patents.

Figure 2B:
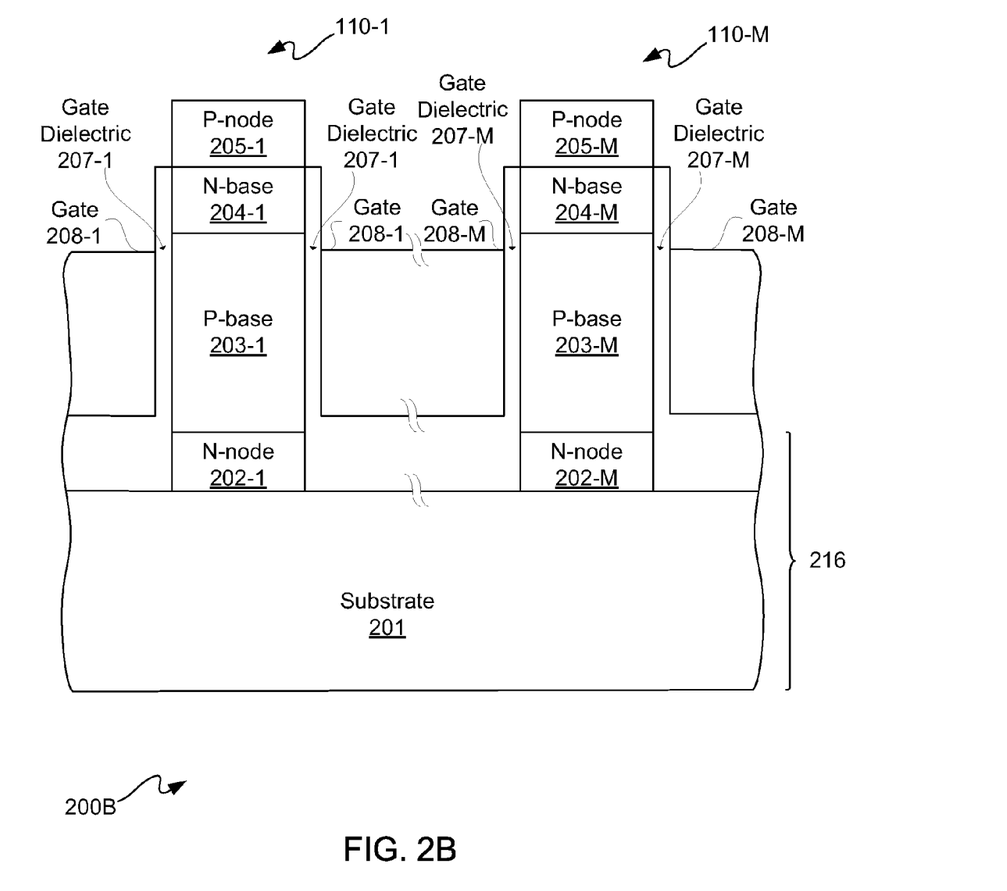

FIG. 2B is a side-view block diagram depicting another exemplary embodiment of vertical thyristor-based memory cells 110-1 through 110-M of an integrated circuit 200B. In this depicted exemplary embodiment, nodes or regions 202-1 through 202-M are n-type, namely n-nodes; bases 203-1 through 203-M are p-type, namely p-bases; bases 204-1 through 204-M are n-type, namely n-bases; and nodes 205-1 through 205-M are p-type, namely p-nodes. In this exemplary embodiment, n-nodes 202-1 through 202-M may be doped to be substantially n-type, and more particularly, may be doped to have an n+ doping level. Furthermore, in this exemplary embodiment, p-nodes 205-1 through 205-M may be doped to be substantially p-type, and more particularly, may be doped to have a p+ doping level. Thus it should be understood that memory cells 110-1 through 110-M of integrated circuit 200B of FIG. 2B have n-p-n-p stack structures.

It should be understood that either sets of nodes 202 or 205 may be coupled to one another to form a "common plate" structure. Accordingly, it should be understood that p-n-p-n or n-p-n-p structures with rows or columns of memory cells having a common plate architecture may be used.

Figure 2C:
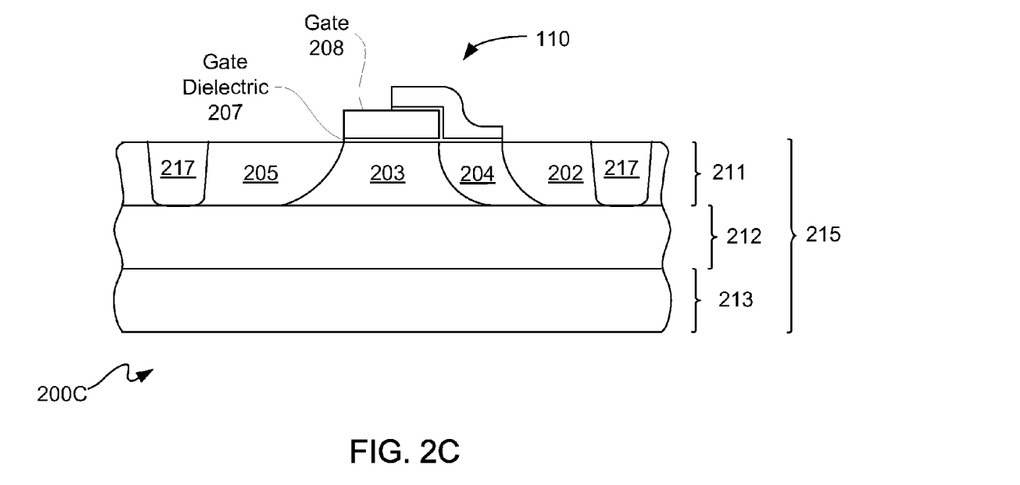
FIGS. 2C and 2D are side-view block diagrams depicting lateral thyristor-based memory cells in semiconductor-on-insulator and bulk integrated circuits, respectively.

FIG. 2C is a side-view block diagram depicting an exemplary embodiment of an integrated circuit 200C having a lateral memory cell 110. In this exemplary embodiment, lateral memory cell 110 is formed on a semiconductor-on-insulator ("SOI") wafer 215 having an active semiconductor substrate layer ("active layer") 211, an insulator layer such as a buried oxide ("BOX") layer 212, and a bottom support substrate layer 213. In active layer 211 are formed a first base 203, a second base 204, and first emitter region 202, and a second emitter region 205. First base 203 may be p-type or n-type as previously described. Second base 204 may be p-type or n-type, as previously described, namely opposite the type of first base 203.

Likewise, first emitter region or node 202 adjacent to second base 204 is of an opposite type of doping than such adjacent base region. Emitter region or node 205 adjacent to first base 203 is likewise of an opposite type doping with respect to such adjacent base region.

A gate dielectric layer providing a gate dielectric 207 may be located directly above a top surface of first base 203, as well as above second base 204. A gate layer providing gate 208 may be located directly above an upper surface of gate dielectric 207. Cells 110 may be separated from one another with isolation regions 217, such as shallow trench isolation ("STI") regions. Some other details regarding formation of lateral thyristor-based memory cells 110 may be found in one or more of the above-referenced U.S. patents.

Figure 2D:
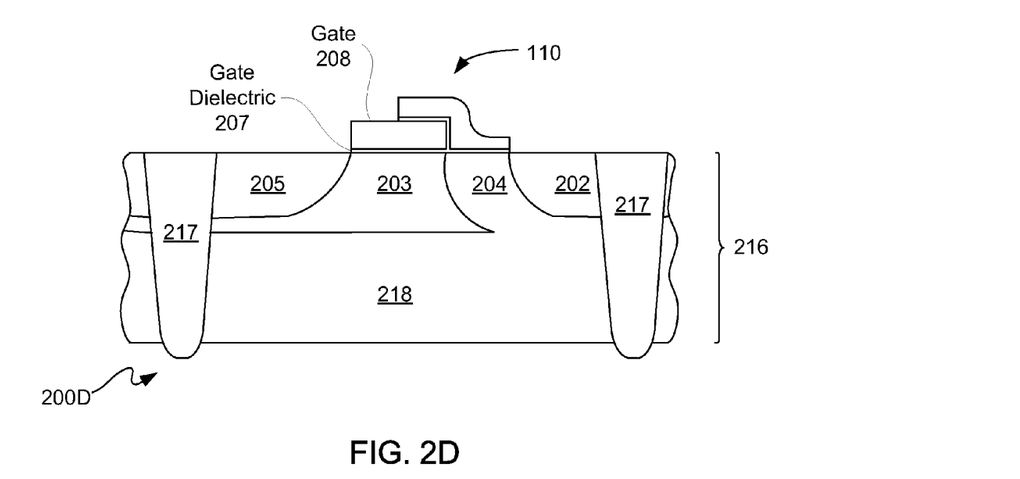

FIG. 2D is a side-view block diagram depicting another exemplary embodiment of a lateral thyristor-based memory cell 110 in an integrated circuit 200D. In this exemplary embodiment, a bulk semiconductor wafer ("substrate") 216 is used for formation of lateral thyristor-based memory cell 110. Isolation regions 217 are formed in substrate 216. Such isolation regions may be STI regions. First base 203 in this exemplary embodiment is formed such that it extends directly above a lightly doped portion 218 of substrate 216, as well as has a portion that extends directly underneath emitter region or node 205. Adjacent to first base 203 may be second base 204, and second base 204 may be contiguous with lightly doped portion 218 and may have a more concentrated doping of a p- or n-type. A portion of second base 204 may extend directly underneath emitter region or node 202. In another embodiment, lightly doped portion 218 may border emitter node 202. Gate dielectric 207 and gate 208 are as previously described with reference to FIG. 2C.

In the following description it shall be apparent that vertical or lateral thyristor-based memory cells 110 may be used, whether such cells are formed using a bulk semiconductor wafer or an SOI wafer. However, for purposes of clarity by way of example and not limitation, it shall be assumed that vertical thyristor-based memory cells are used. Moreover, it shall be assumed that such vertical thyristor-based memory cells are formed using a bulk semiconductor substrate and have a p-base as a first base, namely the base directly located along side a majority of gate 208. Thus it shall be assumed for purposes of clarity and not limitation that an n-p-n-p structure for thyristor-based memory cells 110 is used.

The following embodiments may be used with a memory array of thyristor-base memory cells having either a p-base or an n-base as the first base for each of the cells thereof. Such memory array may or may not be a "common-plate" structure.

Figure 3:
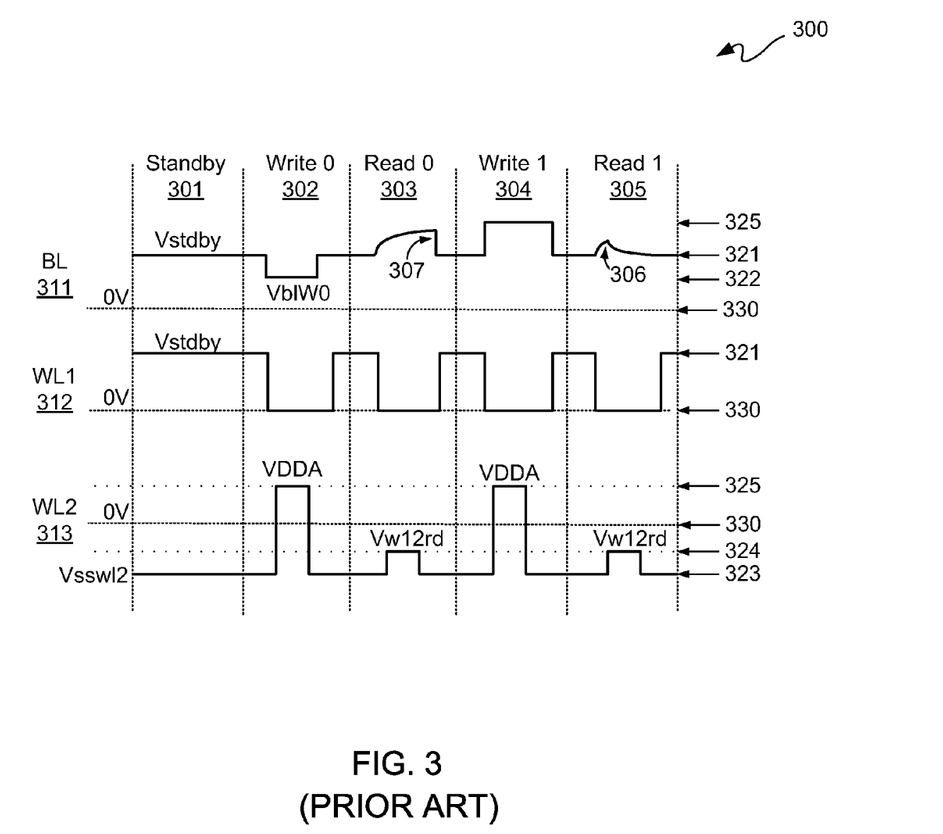
FIG. 3 is a signal diagram depicting an exemplary embodiment of conventional p-TCCT thyristor-based memory operations.

FIG. 3 is a signal diagram depicting an exemplary embodiment of conventional thyristor-based memory operations 300. Operations 300 are for a p-TCCT array of cells for DRAM operation. Such memory array is assumed to have individual WL1s for rows or columns of such an array in contrast to a common plate architecture.

Bitline voltage signaling 311 has a standby voltage level 321, a VDDA voltage level 325, and a bitline write data 0 voltage level 322. WL1 voltage signaling 312 has a standby voltage level 321 and a read/write operational voltage level 330, which in this embodiment is ground 330. WL2 voltage signal 313 has a logic low WL2 voltage level 323 and a WL2 read voltage level 324.

For purposes of clarity by way of example and not limitation, it shall be assumed that standby voltage 321 is approximately 0.7 volts, logic low WL2 voltage 323 is approximately −1.2 volts, bitline write data 0 voltage 322 is approximately 0.4 volts, logic supply voltage Vdd is approximately 0.9 volts, and WL2 read voltage 324 is approximately −0.4 volts.

During standby state 301, bitline voltage signal 311 and WL1 voltage signal 312 are held at standby voltage level 321, and WL2 voltage signal 313 is held at WL2 logic low voltage level 323.

During write 0 state 302, bitline voltage 311 is transitioned to bitline write 0 voltage level 322, and WL1 voltage signal 312 is transitioned to ground 330. During write 0 state 302, WL2 voltage signal 313 is pulsed to a VDDA or VDD voltage 325. To end a write 0 operation during write 0 state 302, bitline signal 311 and WL1 voltage signal 312 are transitioned back to their standby voltage levels 321, and WL2 voltage signal 313 is transitioned back to its logic low WL2 voltage level 323.

During read 0 state 303, WL1 voltage signal 312 is transitioned from its standby voltage level 321 to ground 330. A read circuit connected to each bitline, such as a PMOS transistor for example with its source connected to VDDA and its drain connected to a bitline, is turned on. This allows voltage on bitline 311 to rise to a read 0 voltage level 307, which may be approximately VDDA. For such read operation, WL2 is given a pulse to a WL2 read voltage level 324 on WL2 voltage signal 313. To end a read 0 operation, bitline voltage signal 311 and WL1 voltage signal 312 are returned to their standby voltage levels 321, and WL2 voltage signal 313 is returned to its logic low voltage level 323.

For a write 1 state 304, WL1 voltage signal 312 and WL2 voltage signal 313 are the same as described with respect to write 0 state 302. Bitline voltage signal 311 however is transitioned to a VDDA voltage level 325. To end a write 1 operation, bitline voltage signal 311 and WL1 voltage signal 312 are transitioned to their standby voltage levels 321, and WL2 voltage signal 313 is transitioned to its logic low voltage level 323.

For a read 1 state 305, WL1 voltage signal 312 and WL2 voltage signal 313 and read circuit operation are the same as those described for a read 0 state 303. However, because an active memory cell connected to a bitline flows current, bitline voltage signal 311 eventually settles to a voltage that is lower than VDDA, which for this example embodiment may be around 1 volt. However, such bitline voltage may temporarily rise to a level higher than level 306 before gradually tapering back to a read 1 voltage level. At the conclusion of a read 1 state 305, bitline voltage signal 311 and WL1 voltage signal 312 are transitioned to their standby voltage levels 321, and WL2 voltage signal 313 is transitioned to its logic low voltage level 323.

Figure 4:
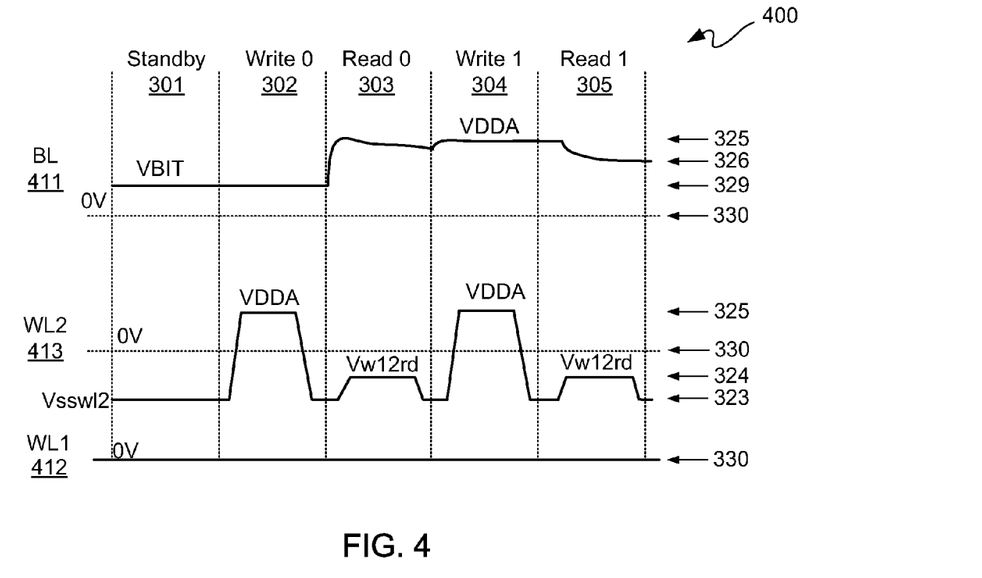
FIG. 4 is a signal diagram depicting an exemplary embodiment of operations for an array of p-TCCT memory cell array having a common plate architecture.
Figure 5:
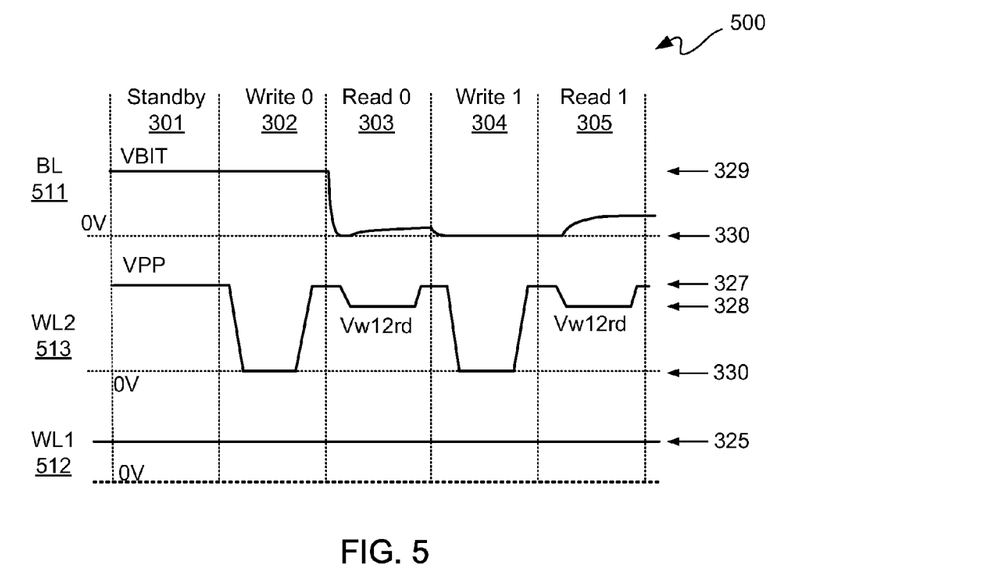
FIG. 5 is a signal diagram depicting an exemplary embodiment of operations for an array of n-TCCT cells having a common plate architecture.

FIG. 4 is a signal diagram depicting an exemplary embodiment of operations 400 for a p-TCCT memory cell array. More particularly, operations 400 are for an array of p-TCCT cells having a common plate architecture, and operations 400 are for DRAM operation. FIG. 5 is a signal diagram depicting an exemplary embodiment of operations 500 for an array of n-TCCT cells having a common plate architecture. More particularly, operations 500 are for such an array for DRAM operation. With simultaneous reference to FIGS. 4 and 5, operations 400 and 500 are further described.

For operations 400 and 500, namely for a common plate architected array, WL1 voltage signal is coupled to a fixed voltage level, and thus is generally constant for all of states 301 through 305. For an array of p-TCCT cells as indicated in FIG. 4, WL1 voltage signal 412 is coupled to ground 330. For an array of n-TCCT cells as indicted for operations 500, WL1 voltage signal 512 is coupled to VDDA 325. Accordingly, it should be immediately appreciated that the absence of transitioning WL1, which as was depicted for operations 300, saves power. In other words, fewer transitions or smaller transition, as described below in additional detail, translates to less power consumption as described herein.

For operations 400, bitline voltage signal 411 is held at a bit voltage level ("VBIT") through standby state 301 and write 0 state 302. In this exemplary embodiment, VBIT voltage level is approximately 0.4 volts. During read 0 state 303, bitline voltage signal 411 is transitioned generally to VDDA 325, and generally remains at such voltage level through the remainder of read 0 state 303 and through write 1 state 304. Bitline voltage signal 411 may enter read 1 state 305 state generally at VDDA 325, but may gradually transition down toward VBIT 329, but may stop short of VBIT 329 settling approximately at about 1 volt generally at level 326 by the end of read 1 state 305. WL2 voltage signal 413 is similar to WL2 voltage signal 313.

Bitline voltage signal 511 and WL2 voltage signal 513 are effectively the inverse of bitline voltage signal 411 and WL2 voltage signal 413, respectively. WL2 has a standby voltage level ("VPP") 327, which in this exemplary embodiment is approximately 2.6 volts. Bitline voltage signal 511 has a standby or bit voltage level of approximately 1.1 volts in this exemplary embodiment. Read WL2 voltage level 328 in this exemplary embodiment is approximately 1.5 volts. VDDA 325 for operations 400 and 500 may be approximately 1.5 volts, as it was for operations 300 of FIG. 3; however, such VDDA voltage level may be reduced. Thus for example, for this exemplary embodiment, operations 400 and 500 may have a VDDA level which is approximately 1.35 volts or even down to approximately 1.20 volts.

Bitline voltage signal 511 for read state 303 transitions from VBIT voltage level 329 to generally ground voltage level 330 and is generally held at ground voltage level 330 throughout the remainder of read 0 state 303 and through write 1 state 304. At the beginning of read 1 state 305, bitline voltage signal 511 is generally at ground voltage level 330 and may transition up to a read 1 voltage level 331 by the end of read 1 state 305. During standby state 301, WL2 voltage signal 513 is at VPP voltage level 327, and during write 0 state 302, WL2 voltage signal 513 is transitioned from VPP voltage level 327 to ground voltage level 330. Toward the end of write 0 state 302, WL2 voltage signal 513 is transitioned back up to VPP voltage level 327.

During read 0 state 303, WL2 voltage signal 513 is transitioned from VPP voltage level 327 to WL2 read voltage level 328, and toward the end of read 0 state 303, WL2 voltage signal 513 is transitioned back up to VPP voltage level 327. Write 1 state 304 and read 1 state 305 are the same the as write 0 state 302 and read 0 state 303, respectively, with respect to pulsing of WL2 voltage signal 513.

It should be understood that a TCCT cell is sometimes referred to as an "inverting" cell. This is because in some instances a read of a data state means having to completely transition bitline voltage for a write of such data state. For example, if the bitline moves to a logic high level VDDA 325 for a read 0 as for example in FIG. 4, then to write a 0 back would mean that the bitline has to be transitioned to a bit voltage level 329. As indicated with bitline voltage signal 411, a read of a data 1 followed by a write-back of a data 1 would mean transitioning from approximately 1 volt level 326 to VDDA 325, which is not as significant as the transition for a read and write back of a data 0. Likewise, for bitline voltage signal 511, reads and write backs of data 0s have a significant transition compared to reads and write backs of data 1s. Thus even though a common plate architected array saves power by not toggling the voltage on WL1, data transitions for read followed by write-back of the same data value do consume power.

It should be understood that a read/modify/write operation is a known operation for reading out a group of bits from an array, modifying some subset or all of those bits, and then writing the bits back to the memory array as modified generally at the same address. It should further be understood that a refresh operation of a memory array involves reading out data states and writing back those same data states read.

A read of a data 0 and write back of a data 1 involves little if any bitline voltage transition, and a read of a data 1 and a write back of a data 0, while involving some data transition, may consume less power than a read of a data 0 and write back of a data 0. In addition to less bitline transitions, writing back of opposite data for data 1 may minimize the duration for which a memory cell flows current. Thus, by writing back an opposite data state of that read, such as for a refresh operation, read-modify-write operation, or other memory operation involving reads and write backs, power consumption may be reduced.

Another benefit of writing back the opposite data state may be that the sense amplifier circuit design is simpler to implement, smaller in area, and/or faster to operate. As described in additional detail in a co-pending patent application entitled "Sense Amplifiers and Operations Thereof", by Farid Nemati, filed the same date hereof, assigned application Ser. No. 13/172,017, which is incorporated herein in its entirety for all purposes, sense amplifiers are described that allow for reading a data value in one state and writing back a data value of an opposite state for power savings. Thus for example, for a refresh operation, rather than a conventional reading of a data 0 and writing back a data 0, a read of a data 0 may be followed with a write-back of a data 1 so as to conserve power as there is very little power consumed with respect to toggling of a bitline, because generally such a bitline is held at a same voltage value between a read of a data 0 and a write-back of a data 1 as indicated for bitline voltage signals 411 and 511 for a common plate architecture. Likewise, a read of a data 1 may be followed by a write back of a data 0, which has some bitline voltage transition as indicated for bitline voltage signals 411 and 511, but less than a conventional read 0 and write back 0 transition.

However, to allow a read and inverted write-back, whether for a read/modify/write operation, a refresh operation, and the like, bit state tracking is used to allow a write-back after a read to write an opposite data state. The following description is for how such bits may be tracked in order to allow the opposite data state to be written back to conserve power for a common plate architected array of TCCT cells.

Figure 6:
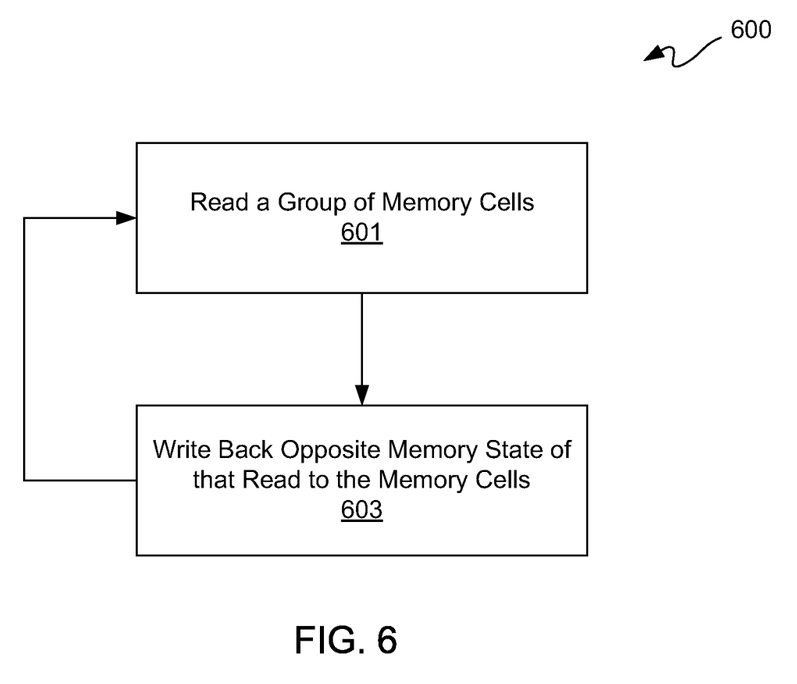
FIG. 6 is a flow diagram depicting an exemplary embodiment of a refresh flow.

FIG. 6 is a flow diagram depicting an exemplary embodiment of a refresh flow 600. Even though a refresh example embodiment is shown for purposes of clarity, it should be understood that other memory read and write back sequences may be used.

At 601 a group of thyristor-based memory cells are read to obtain read data. Such group of memory cells may be a subarray, a row or a column of memory cells of an array of memory cells. For purposes of clarity by way of example and not limitation, it shall be assumed that a row of memory cells is read. It should further be understood that such memory cells may have either or both D0 and D1 states.

At 603, the read data obtained at 601 is written back to such row in corresponding cell locations. However, the data written back is the opposite memory state of the data that was read. Generally, this may be thought of as "inverting" the bits and then writing them back; however, as indicated with bitline voltage signals 411 and 511, there is no inversion, namely there is not an inverter, but rather the voltage levels are used indicate the state of the bits being written back. Accordingly, if a row of memory cells was read with D0s and D1s, the bit values written back would be the opposite states of those read.

In addition to the data bits read out at 601, there are one or more "polarity" or "tracking" ("check") bits read out that may reside on the same row. Thus for example each WL2 may have additional cells which are used to track whether data stored in an array of TCCT is inverted or not. It should be understood that after an initial write, data stored in cells is in its original state and the check bit(s) are written with a "code" that indicates normal polarity for example all zeros. If such data is refreshed with an inverting refresh, then such data may be stored in an inverted state. Such additional check bit(s) associated with a WL2 will also be inverted and hold for example all ones which may be used to indicate whether such data read out after such refresh is an inverted state. Furthermore, it should be understood that if an even number of refreshes has occurred, then on each even numbered refresh cycle, such data is refreshed back to its original state. In short, odd numbered refreshes have inverted data stored in an array, and even numbered refreshes have original data states stored in an array, assuming there are no other intervening read-and-invert-write-back operations. Viewed another way, if there are an even number of read-and-invert-write-back operations performed on a TCCT cell, then such cell is in its original data state, and if there is an odd number of read-and-invert write-back operations performed on a TCCT cell, then data in such cell is in its inverted state.

In principle, tracking the "polarity" of any given row can be achieved using only one check bit with the operations described above. However, to increase robustness of such tracking with respect to inadvertent fails, for example soft errors caused by cosmic or alpha particle hits reversing the state of a check bit, it may be useful to use multiple check bits that are spread across the same row and use coding schemes such as "majority logic" gates to decide the polarity of the row using such check bits.

Figure 7:
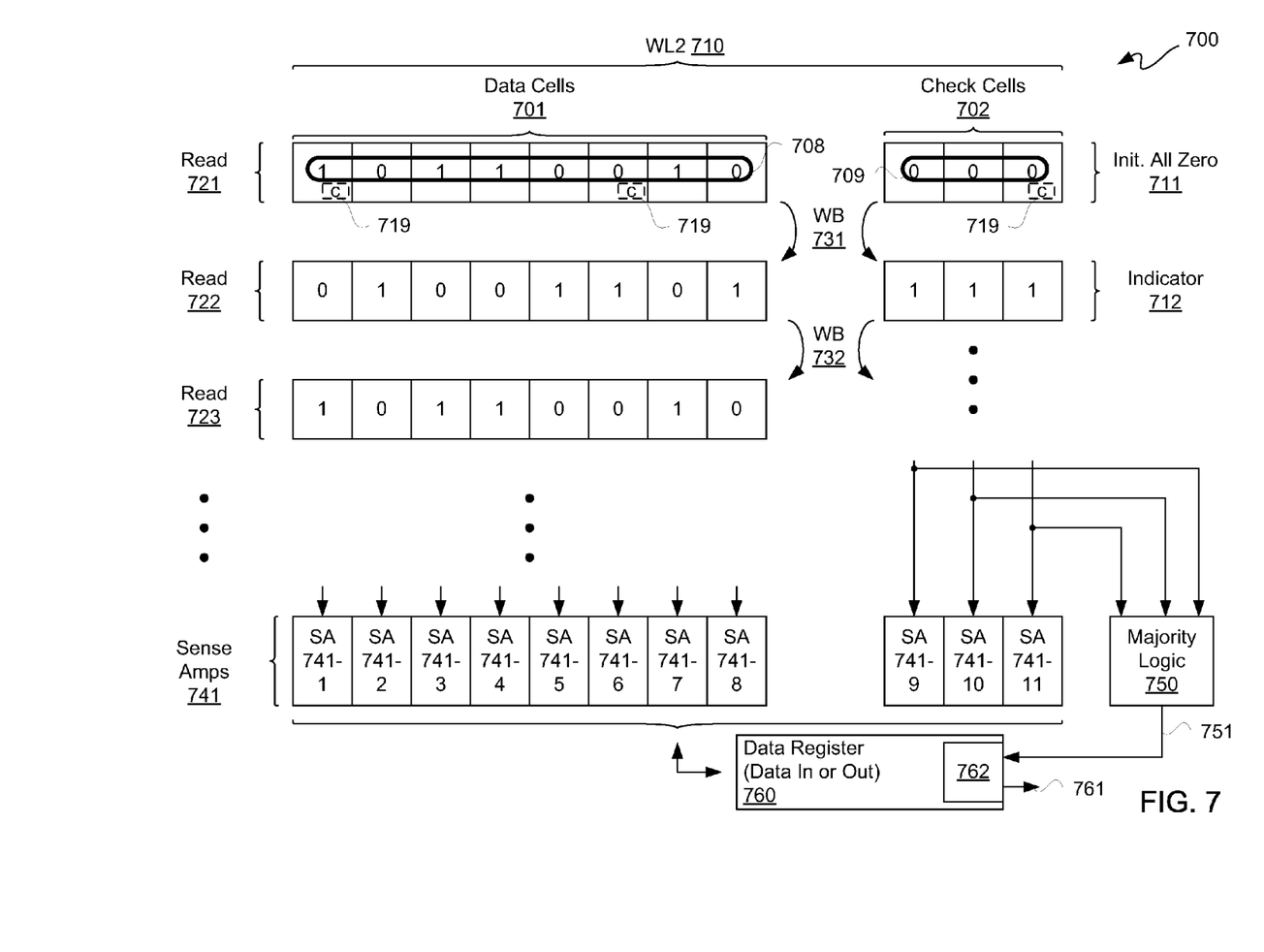
FIG. 7 is a block diagram depicting an exemplary embodiment of a read-and-invert-write-back flow.

FIG. 7 is a block diagram depicting an exemplary embodiment of a read-and-invert-write-back flow 700. A WL2 710 has data cells 701 and check cells 702. Within data cells 701, data bits 708 are stored. Within check cells 702, check bits 709 are stored. Even though three check cells 702 for three check bits 709 are illustratively depicted, it should be understood that generally any number of bits to track "polarity" of data stored in an array may be used. However, because majority logic 750 is used in this embodiment, an odd number of bits may be used. Furthermore, because of the possibility of a single event upset of a check bit, more than one check bit may be used to avoid an erroneous reading of data. Furthermore, even though eight data bits 708 associated with eight data cells 701 are illustratively depicted; fewer or more data bits and cells may be used. Along those lines, conventionally at least 256 bits may be accessed at a time for a refresh operation.

Even though check bits 709 and check cells 702 are shown to all be on one side of data bits 708 as associated with data cells 701, it should be understood that check cells, and associated bits, may be distributed within WL2 710 as indicted by dashed "c" blocks 719. This distribution of check cells may be less susceptible to impact of an upset. However, for purposes of clarity by way of example and not limitation, it shall assumed that check cells an bits are to one side of WL2 710.

At 711, check bits 709 of check cells 702 are all initialized to the same value. In the exemplary embodiment depicted, this is a data 1 ("D0") value; however, optionally a data 1 ("D1") value may be used as an initialization value. For purposes of by way of example and not limitation, it shall be assumed that an original data state is indicated by check bits 709 being D0s. At 721, data bits 708 along with check bits 709 are read from their associated cells.

Read 721 may be part of a refresh or part of a read/modify/write or part of some other read and write back access to a memory array. At 731, data bits 708 read at 721 are written back with opposite state voltage. Likewise, check bits 709 are written back to their associated check bit cells 702 with their opposite data state voltage at 731. This is generally depicted in FIG. 7 by denoting the data values in cells 701 and 702 are of opposite data states for a next read, namely read 722. In particular, checks bits 709 are all flipped from their initial all D0 state to all D1s as an indicator 712 that data read out on a subsequent cycle, namely read 722, has been inverted.

For a subsequent read 722, another write-back 732 may be performed in which case indicator 712 would be all D0s. However, for purposes of clarity by way of example and not limitation, it shall be assumed that only one read-and-invert-write-back cycle has been performed on original data, as it shall be understood from such description how multiple cycles, whether totaling odd or even, may be implemented.

Check bits 709 may be input to a majority logic block 750. Majority logic block 750 may determine whether more D1s or D0s are present in indicator 712. If more D1s are present, then in the exemplary embodiment, the read data out is in an inverted state. If, however, indicator 712 in the exemplary embodiment has more D0s, then the data read out is in its original state.

Output of majority logic 750 is read data state signal 751. Again, if one of indicator bits 712 is flipped due to a single event upset, majority logic 750 based on the other two check bits being correct will produce a correct value for read data state 751. Read data state 751 may be used as a control signal as to whether the data output from an array is to be inverted for output or not inverted for output. For example, data bits 708 obtained from read 722 may be provided to sense amplifiers 741-1 through 741-8, respectively, likewise, check bits 709 may be provided to sense amplifier 741-9 through 741-11. Sense amplifiers 741 may read-invert-write-back sense amplifiers. Again, such sense amplifiers are described in additional detail in the above-referenced co-pending application which is incorporated by reference herein in its entirety for all purposes.

Data from sense amplifiers 741 may be transferred to a data register 760. If read data state 751 indicates that the read data is in an inverted state, data register 760 inverts such read data before providing data out 761. If, however, read data state signal 751 indicates that read data obtained from sense amplifiers 741 is in an original or non-inverted state, data registers 760 does not invert data out 761.

Of course, extra cells for storing check bits 709 are added, such as for each WL2. Furthermore, internal data in/data out multiplexing to and from sense amplifiers, such as sense amplifiers 741, is added. Thus, data register 760 may include a multiplexing circuit 762 for receiving read data state signal 751 as a control signal for providing data out 761.

Accordingly, it should be appreciated that the degree of bitline transitions may be substantially reduced, and thus less power is consumed by data refresh, and data read/modify/write, among other possible memory array read and write back access operations. Furthermore, sense amplifier design may be less complex because less bitline transitions may be implemented.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, even though use of thyristor-based memory cells have been described, any other types of memory cells may be used. Claim(s) listing steps do not imply any order of the steps. Trademarks are the property of their respective owners.

What is claimed is:

1. A method of operating a group of memory cells, comprising:
    reading the group of memory cells to obtain read data;
    the group of memory cells including data cells and at least one check cell;
    the read data including check data associated with the at least one check cell;
    writing back opposite data states for the read data to the group of memory cells; and
    wherein the check data indicates polarity of the read data.

2. The method according to claim 1, further comprising:
    inverting the read data responsive to the check data to provide data read; and
    outputting the data read.

3. The method according to claim 1, further comprising:
    at least three check cells, including the at least one check cell, for storing at least three check bits for the check data; and
    initializing state of the check data all to a same data state.

4. The method according to claim 3, wherein the group of memory cells is a group of thyristor-based memory cells.

5. The method according to claim 3, wherein there is an odd integer number of the at least three check cells.

6. The method according to claim 3, further comprising determining the polarity of the read data responsive to a majority state of the check data.

7. The method according to claim 1, wherein:
    the group of memory cells is a group of thyristor-based memory cells in an array coupled to a common wordline; and
    the common wordline is coupled to either an anode or cathode emitter of each cell of multiple columns in the array.

8. The method according to claim 7, wherein the group of thyristor-based memory cells are n-TCCT cells.

9. The method according to claim 7, wherein the group of thyristor-based memory cells are p-TCCT cells.

10. The method according to claim 7, wherein the common wordline is directly coupled to ground.

11. The method according to claim 7, wherein the common wordline is directly coupled to an input/output supply voltage.

12. An integrated circuit, comprising:
an array of memory cells;
a grouping of memory cells of the array of memory cells including data cells and at least one check cell; and
the at least one check cell to track inversion/non-inversion status of the data cells associated therewith; and
sense amplifiers coupled to obtain read information from the grouping and to write back data states opposite of those of the read information.

13. The integrated circuit according to claim 12, further comprising majority logic coupled to receive the read information from the at least one check cell and configured to provide a status signal of a majority data state of the read information of the at least one check cell.

14. The integrated circuit according to claim 13, further comprising:
a data register coupled to the sense amplifiers;
select logic coupled to or part of the data register;
wherein the select logic is coupled to receive data out from the data registers and the indication from the majority logic; and
wherein the select logic is configured to output the data out in an inverted form or a non-inverted form responsive to the status signal.

15. The integrated circuit according to claim 12, wherein the grouping of memory cells is a grouping of thyristor-based memory.

16. The integrated circuit according to claim 15, wherein:
the grouping of thyristor-based memory cells are coupled to a common wordline to either anode or cathode emitters of each cell of thyristor-based memory cells; and
the common wordline is common to multiple columns of cells in the array of thyristor-based memory cells.

17. The integrated circuit according to claim 16, wherein the array of thyristor-based memory cells are n-TCCT cells.

18. The integrated circuit according to claim 16, wherein the thyristor-based memory cells are p-TCCT cells.

19. The integrated circuit according to claim 16, wherein the common wordline is directly coupled to ground.

20. The integrated circuit according to claim 16, wherein the common wordline is directly coupled to an input/output supply voltage.

* * * * *